United States Patent
Kawano et al.

(10) Patent No.: US 8,957,795 B2
(45) Date of Patent: Feb. 17, 2015

(54) ANALOG-TO-DIGITAL CONVERSION DEVICE

(71) Applicant: Fujitsu Semiconductor Limited, Yokohama-shi, Kanagawa (JP)

(72) Inventors: Youji Kawano, Iizuka (JP); Motoki Shimozono, Fukuoka (JP); Youichi Satou, Kurume (JP); Kazuhiro Konomoto, Kasugai (JP); Satoru Mizuta, Kasugai (JP); Masashi Kijima, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 14/185,630

(22) Filed: Feb. 20, 2014

(65) Prior Publication Data

US 2014/0240151 A1   Aug. 28, 2014

(30) Foreign Application Priority Data

Feb. 25, 2013 (JP) ................................. 2013-034779

(51) Int. Cl.
H03M 1/06 (2006.01)
(52) U.S. Cl.
CPC ................................. *H03M 1/0634* (2013.01)
USPC .......................................... 341/118; 341/155
(58) Field of Classification Search
CPC .............. H03M 1/001; H03M 1/0634; H03M 2201/4135
USPC .................................................. 341/118, 155
See application file for complete search history.

(56) References Cited

U.S. PATENT DOCUMENTS

| | | | | |
|---|---|---|---|---|
| 4,337,456 A | * | 6/1982 | Deffendall et al. | 341/118 |
| 5,121,119 A | * | 6/1992 | Higuchi et al. | 341/120 |
| 5,146,223 A | * | 9/1992 | Muto | 341/118 |
| 7,414,553 B1 | * | 8/2008 | Tsyrganovich | 341/118 |

FOREIGN PATENT DOCUMENTS

| | | |
|---|---|---|
| JP | 10-145231 A | 5/1998 |
| JP | 11-088166 A | 3/1999 |
| JP | 2005-244771 A | 9/2005 |

* cited by examiner

*Primary Examiner* — Khai M Nguyen
(74) *Attorney, Agent, or Firm* — Arent Fox LLP

(57) ABSTRACT

An analog-to-digital conversion device includes: an analog-to-digital converter that receives an analog voltage and converts the analog voltage into a digital value to output the converted digital value; and an offset correction unit that arithmetically operates an offset correction value based on a first digital value and a second digital value, the first digital value being to be output from the analog-to-digital converter by the analog-to-digital converter receiving a first analog voltage, the second digital value being to be output from the analog-to-digital converter by the analog-to-digital converter receiving a second analog voltage, the second analog voltage having a voltage value different from that of the first analog voltage, in which after the arithmetic operation of the offset correction value, the analog-to-digital converter outputs a digital value obtained by subtracting the offset correction value from the converted digital value.

5 Claims, 4 Drawing Sheets

F I G. 1A
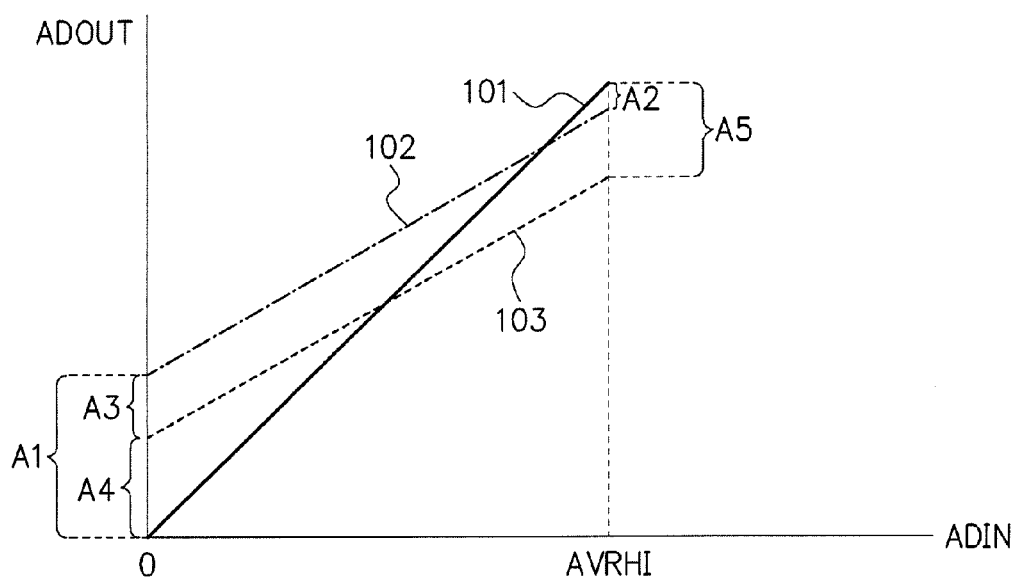
F I G. 1B
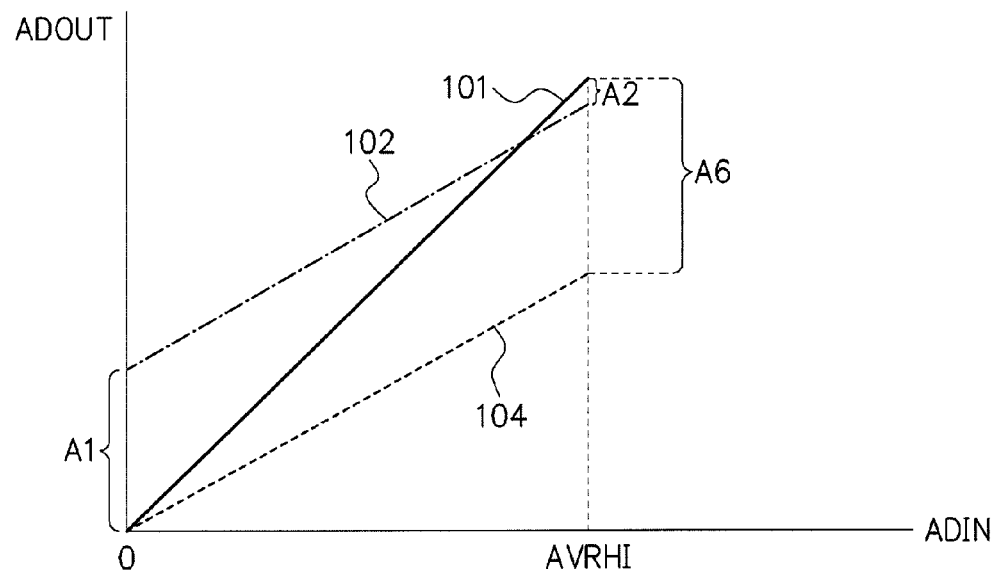

FIG. 2

F I G. 4
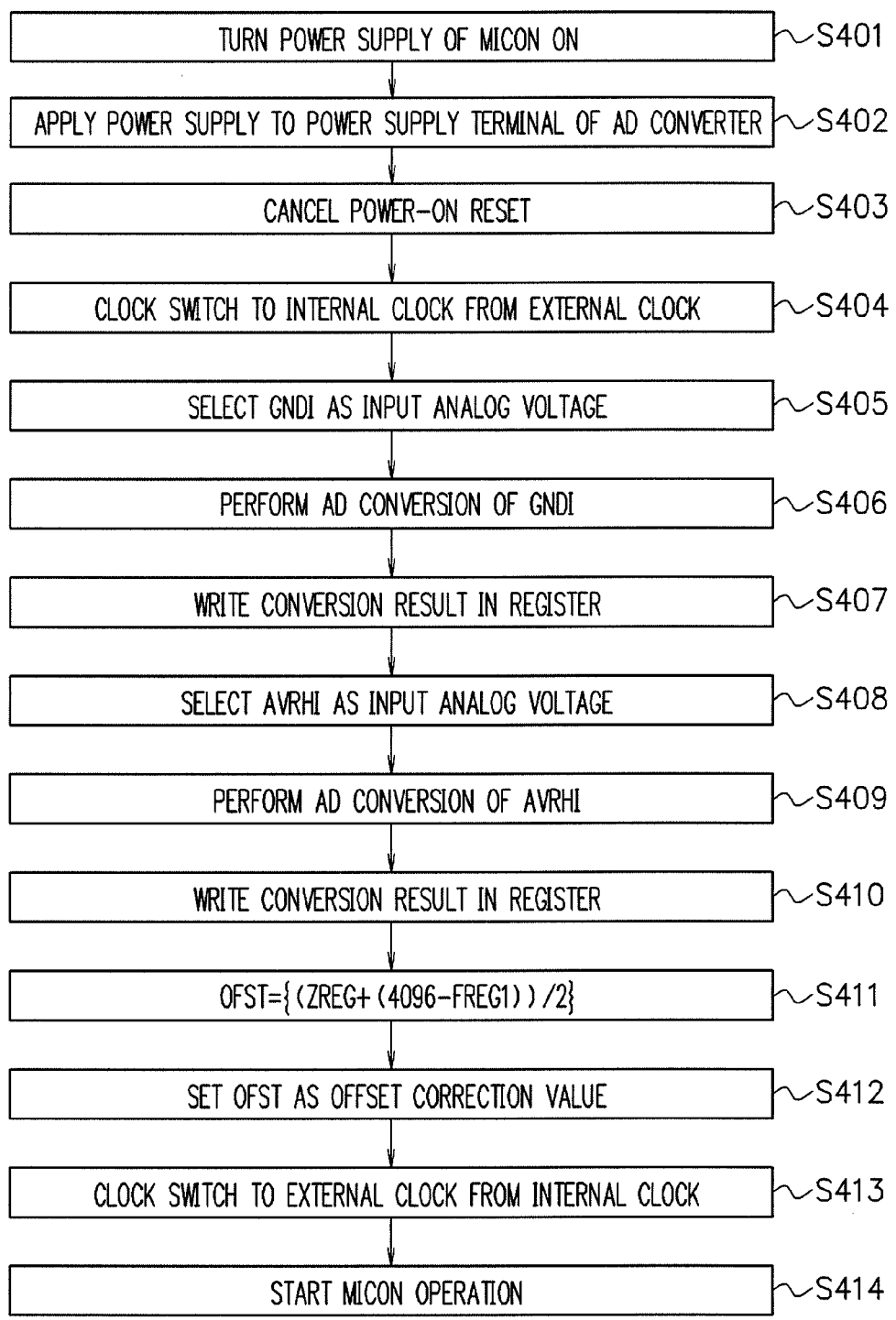

ANALOG-TO-DIGITAL CONVERSION DEVICE

CROSS-REFERENCE TO RELATED APPLICATION

This application is based upon and claims the benefit of priority of the prior Japanese Patent Application No. 2013-034779, filed on Feb. 25, 2013, the entire contents of which are incorporated herein by reference.

FIELD

The embodiment is related to an analog-to-digital conversion device.

BACKGROUND

In a successive approximation type analog-to-digital conversion device, an offset error occurs with respect to a comparator comparing a reference voltage and an input voltage due to a configuration of the device. When the offset error is large, an overall error of the analog-to-digital conversion device becomes large. The offset error is corrected appropriately, thereby making it possible to make the overall error of the analog-to-digital conversion device small. When a microcontroller has the analog-to-digital conversion device mounted thereon to be used, the overall error becomes large due to variations in peripheral parts and a peripheral environment (temperature, voltage, and the like), in addition to manufacture variations in the analog-to-digital conversion device itself. The overall error is a parameter considered to be important in the field of motors, in particular, and it is also said that making this value as small as possible is needed in the market. Further, in the field of motors, it is necessary to perform a feedback of analog-to-digital conversion (and correction) to torque control processing to a motor in a cycle in which a system is determined, and it is also said that suppressing a load on a central processing unit (CPU) as much as possible is needed in the market.

There has been known an A/D conversion circuit that converts an analog signal to be measured into a digital signal and corrects an error of the conversion (see Patent Document 1, for example). The A/D conversion circuit, when a temperature change is detected in terms of temperature near an A/D converter to be measured by a temperature measurement circuit, searches a memory circuit for a correction value corresponding to the measured temperature, and when the correction value exists, uses the searched correction value for the succeeding error corrections.

Further, there has been known a data correcting method in an A/D conversion device that converts an input analog signal into a digital signal to output it (see Patent Document 2, for example). In the data correcting method, a correction value of a digital signal obtained after an analog signal is converted into a digital signal is obtained by a difference in value between a digital signal obtained by using a least-square method and an ideal digital signal provided beforehand. Then, based on this correction value, a gain/offset error and a non-linearity error are correction-operated.

Further, there has been known an A/D converter that reads a correction value based on an error between a converted value obtained by the A/D converter and a theoretical value from a non-volatile memory by a control circuit and outputs a value obtained by correcting the converted value by the read correction value as an A/D conversion result (see Patent Document 3, for example).

Patent Document 1: Japanese Laid-open Patent Publication No. 2005-244771
Patent Document 2: Japanese Laid-open Patent Publication No. 10-145231
Patent Document 3: Japanese Laid-open Patent Publication No. 11-88166

In order to make the overall error of the analog-to-digital conversion device small, a complex correction operation and a large-capacity memory are needed, and problems of a decrease in throughput and an increase in size of the analog-to-digital conversion device exist.

SUMMARY

An analog-to-digital conversion device includes: an analog-to-digital converter that receives an analog voltage and converts the analog voltage into a digital value to output the converted digital value; and an offset correction unit that arithmetically operates an offset correction value based on a first digital value and a second digital value, the first digital value being to be output from the analog-to-digital converter by the analog-to-digital converter receiving a first analog voltage, the second digital value being to be output from the analog-to-digital converter by the analog-to-digital converter receiving a second analog voltage, the second analog voltage having a voltage value different from that of the first analog voltage, in which after the arithmetic operation of the offset correction value, the analog-to-digital converter outputs a digital value obtained by subtracting the offset correction value from the converted digital value.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1A and FIG. 1B are graphs depicting examples of input/output characteristics of an analog-to-digital conversion device;

FIG. 2 is a view depicting a configuration example of a microcontroller according to this embodiment;

FIG. 4 is a flow chart depicting a processing example of the microcontroller in FIG. 2.

DESCRIPTION OF EMBODIMENTS

Figure 3:
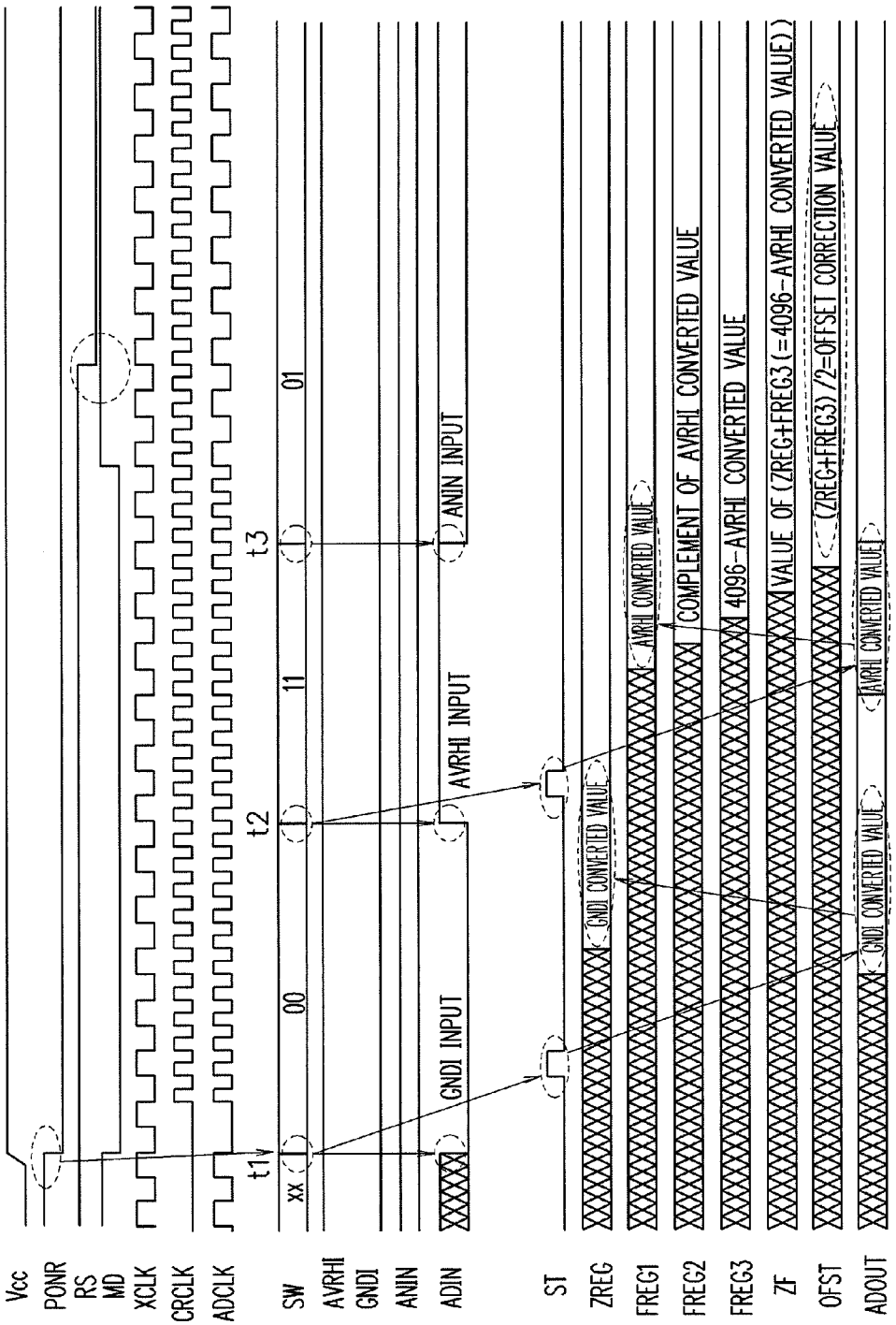
FIG. 3 is a timing chart depicting an operation example of the microcontroller in FIG. 2.

FIG. 1A is a graph depicting examples of input/output characteristics of an analog-to-digital conversion device according to this embodiment. The horizon axis indicates an input analog voltage ADIN of the analog-to-digital conversion device. The vertical axis indicates an output digital value ADOUT of the analog-to-digital conversion device. The analog-to-digital conversion device receives the analog voltage ADIN and converts the analog voltage ADIN into the digital value ADOUT to output the converted digital value ADOUT. A straight line 101 indicates an ideal input/output characteristic. A straight line 102 indicates an actual input/output characteristic before correction. A straight line 103 indicates an input/output characteristic after correction. With regard to the input range of the analog voltage ADIN, the lowest voltage is 0 [V] and the highest voltage is AVRHI [V].

The straight line 101 indicating the ideal input/output characteristic is expressed by the following Expression (1). Here, K1 represents a gain of the analog-to-digital conversion device.

$$\text{ADOUT} = K1 \times \text{ADIN} \quad (1)$$

In contrast to the straight line 101 of the ideal input/output characteristic by Expression (1), the straight line 102 of the actual input/output characteristic is expressed by a linear function with an intercept A1 and a slope $(1+\alpha) \times K1$ by a gain error $\alpha$ and an offset error A1 as expressed by the following Expression (2).

$$\text{ADOUT}a = (1+\alpha) \times K1 \times \text{ADIN} + A1 \quad (2)$$

Next, there are explained methods of calculating the above-described offset error A1 and gain error $\alpha$. First, the method of calculating the offset error A1 is explained. When an output digital value ADOUTa at the time of the input analog voltage ADIN being 0 [V] is set to ADOUTg, the output digital value ADOUTg is expressed by the following Expression (3) based on Expression (2).

$$ADOUTg = (1+\alpha) \times K1 \times 0 + A1 \quad (3)$$
$$= A1$$

Thus, the offset error A1 can be calculated as the same value as the output digital value ADOUTg.

Next, the method of calculating the gain error $\alpha$ is explained. When an output digital value ADOUTa at the time of the input analog voltage ADIN being a reference voltage ADINr (for example, the highest voltage) is set to ADOUTr, the output digital value ADOUTr is expressed by the following Expression (4) according to Expression (2).

$$\text{ADOUT}r = (1+\alpha) \times K1 \times \text{ADIN}r + A1 \quad (4)$$

According to Expression (4), the gain error $\alpha$ is expressed by the following Expression (5)

$$\alpha = ((\text{ADOUT}r - A1)/(K1 \times \text{ADIN}r)) - 1 \quad (5)$$

An ideal output digital value ADOUT of Expression (1) is calculated by using the offset error A1 of Expression (3) and the gain error $\alpha$ of Expression (5) based on the actual output digital value ADOUTa of Expression (2). Specifically, the following Expression (6) is established according to Expression (1).

$$\text{ADIN} = \text{ADOUT}/K1 \quad (6)$$

When Expression (6) is substituted into Expression (2), the following Expression (7) is established.

$$ADOUTa = (1+\alpha) \times K1 \times (ADOUT/K1) + A1 \quad (7)$$
$$= (1+\alpha) \times ADOUT + A1$$

According to Expression (7), the ideal output digital value ADOUT is expressed by the following Expression (8)

$$\text{ADOUT} = (\text{ADOUT}a - A1)/(1+\alpha) \quad (8)$$

As above, as long as the offset error A1 is calculated by Expression (3) and the gain error $\alpha$ is calculated by Expression (5), it is possible to calculate the ideal output digital value ADOUT based on the actual output digital value ADOUTa by using Expression (8).

However, in this method, it is necessary to perform the following two pieces of processing in each analog-to-digital conversion.

[1] Reading the offset error A1 and the gain error $\alpha$ from a memory

[2] Correcting the output digital value by the above-described arithmetic operation processing by a CPU These pieces of processing are relatively complex to put a load on the CPU, and in a system in which the analog-to-digital conversion is performed frequently, for example, a decrease in throughput is caused. Further, software for the correction processing is needed. Further, it is necessary to prepare a memory for storing the offset error A1 and the gain error $\alpha$ therein and an increase in size of a semiconductor chip is also concerned.

Thus, in this embodiment, an offset correction value A3 is subtracted from an output digital value ADOUT of the straight line 102 of the actual input/output characteristic, to thereby obtain an output digital value ADOUT of the straight line 103 of the input/output characteristic after correction. This embodiment has correction accuracy inferior to that by the above-described correction method, but can correct the error by the simple arithmetic operation (subtraction) with no need for a large-capacity memory, so that it is possible to prevent a decrease in throughput and to prevent an increase in size of the analog-to-digital conversion device.

Next, there is explained a method of arithmetically operating the offset correction value A3. In the case of a 12-bit analog-to-digital conversion device, for example, with regard to the input range of the analog voltage ADIN, the lowest analog voltage is 0 V and the highest analog voltage is AVRHI (5 V, for example), and with regard to the output range of the digital value ADOUT, the minimum digital value is "0" and the maximum digital value is "4096."

At the time of the input analog voltage ADIN being the lowest voltage of 0 [V], the output digital value ADOUT of the straight line 102 of the actual input/output characteristic has an error A1 by contrast to an output digital value ADOUT (=0) of the straight line 101 of the ideal input/output characteristic.

Further, at the time of the input analog voltage ADIN being the highest voltage of AVRHI, the output digital value ADOUT of the straight line 102 of the actual input/output characteristic has an error A2 by contrast to the output digital value ADOUT (=4096) of the straight line 101 of the ideal input/output characteristic.

The offset correction value A3 is arithmetically operated as an average value of an absolute value of the error A1 and an absolute value of the error A2 as expressed by the following Expression (9).

$$A3 = (|A1| + |A2|)/2 \quad (9)$$

Thereafter, as described above, the offset correction value A3 is subtracted from the output digital value ADOUT of the straight line 102 of the actual input/output characteristic, to thereby obtain the output digital value ADOUT of the straight line 103 of the input/output characteristic after correction.

At the time of the input analog voltage ADIN being the lowest voltage of 0 [V], the output digital value ADOUT of the straight line 102 of the input/output characteristic before correction has the error A1 by contrast to the output digital value ADOUT of the straight line 101 of the ideal input/output characteristic, and at the time of the input analog voltage ADIN being the highest voltage of AVRHI, the output digital value ADOUT of the straight line 102 of the input/output characteristic before correction has the error A2 by contrast to the output digital value ADOUT of the straight line 101 of the ideal input/output characteristic. Thus, the output digital value ADOUT of the straight line 102 of the input/output characteristic before correction has the maximum error of A1.

In contrast to this, at the time of the input analog voltage ADIN being the lowest voltage of 0 [V], the output digital value ADOUT of the straight line 103 of the input/output characteristic after correction has an error A4 by contrast to the output digital value ADOUT of the straight line 101 of the ideal input/output characteristic, and at the time of the input analog voltage ADIN being the highest voltage of AVRHI, the output digital value ADOUT of the straight line 103 of the input/output characteristic after correction has an error A5 by contrast to the output digital value ADOUT of the straight line 101 of the ideal input/output characteristic. Thus, the output digital value ADOUT of the straight line 103 of the input/output characteristic after correction has the maximum error of A4 or A5, which becomes smaller than the maximum error A1 of the output digital value ADOUT of the straight line 102 of the input/output characteristic before correction described above.

FIG. 1B corresponds to FIG. 1A and is a graph for explaining a correction method for making the offset error A1 zero. An output digital value ADOUT of a straight line 104 of an input/output characteristic after correction is obtained by subtracting the offset error A1 from the output digital value ADOUT of the straight line 102 of the actual input/output characteristic. At the time of the input analog voltage ADIN being the lowest voltage of 0 [V], the output digital value ADOUT of the straight line 104 of the input/output characteristic after correction has an error of zero by contrast to the output digital value ADOUT of the straight line 101 of the ideal input/output characteristic, and at the time of the input analog voltage ADIN being the highest voltage of AVRHI, the output digital value ADOUT of the straight line 104 of the input/output characteristic after correction has an error A6 by contrast to the output digital value ADOUT of the straight line 101 of the ideal input/output characteristic. Thus, the output digital value ADOUT of the straight line 104 of the input/output characteristic after correction has the maximum error of A6, which becomes larger than the maximum error A4 or A5 of the output digital value ADOUT of the straight line 103 of the input/output characteristic after correction in FIG. 1A. Thus, the correction of the straight line 103 in FIG. 1A is more favorable than the correction of the straight line 104 in FIG. 1B.

Figure 2:
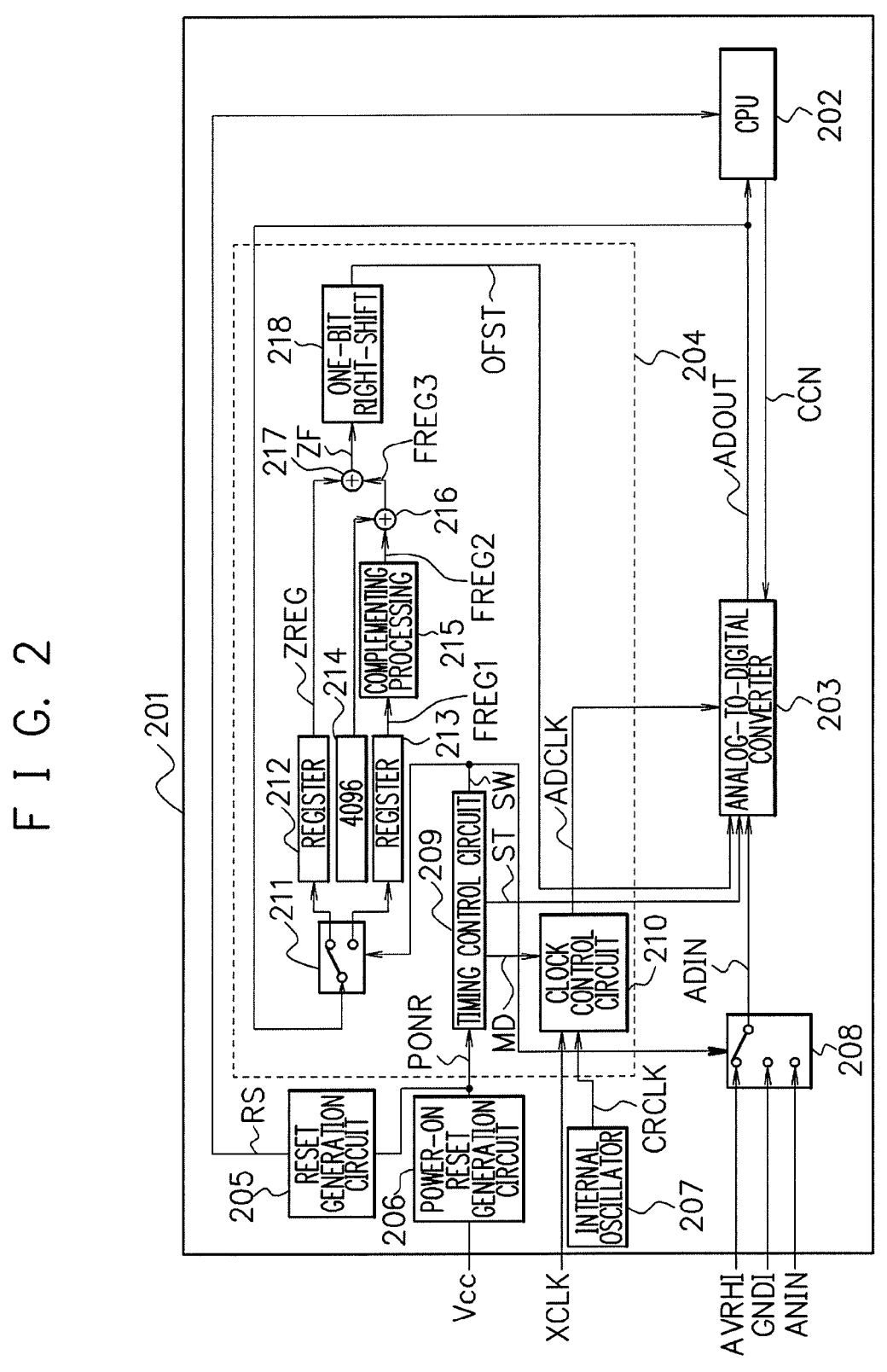

FIG. 2 is a view depicting a configuration example of a microcontroller 201 according to this embodiment. The microcontroller 201 has a CPU 202 and the analog-to-digital conversion device. The analog-to-digital conversion device has an analog-to-digital converter 203, an offset correction unit 204, a reset generation circuit 205, a power-on reset generation circuit 206, an internal oscillator 207, and a selector 208. The offset correction unit 204 has a timing control circuit 209, a clock control circuit 210, a switch 211, registers 212 to 214, a complementing processing circuit 215, adders 216 and 217, and a one-bit right-shift circuit 218.

FIG. 3 is a timing chart depicting an operation example of the microcontroller 201 in FIG. 2 and FIG. 4 is a flow chart depicting a processing example of the microcontroller 201 in FIG. 2. The microcontroller 201 externally receives a power supply voltage Vcc and an external clock signal XCLK. At the initial stage, the power supply voltage Vcc is 0 [V], a power-on reset signal PONR is at a high level, and a reset signal RS is at a high level.

At Step S401, when a power supply of the microcontroller (micon) 201 is turned on, the power supply voltage Vcc rises to 5 V from 0 V. Next, at Step S402, the microcontroller 201 applies the power supply voltage to a power supply terminal of the analog-to-digital (AD) converter 203. Next, at Step S403, when the power supply voltage Vcc becomes higher than a threshold value, the power-on reset generation circuit 206 switches the power-on reset signal PONR to a low level from a high level. When the power-on reset signal PONR is turned to a low level, the offset correction unit 204 starts to arithmetically operate an offset correction value OFST below.

Next, at Step S404, when the power-on reset signal PONR falls to a low level, the timing control circuit 209 changes a switching signal MD to a low level from a high level. The clock control circuit 210 selects the external clock signal XCLK in the case of the switching signal MD being at a high level and selects an internal clock signal CRCLK to be generated by the internal oscillator 207 in the case of the switching signal MD being at a low level to output the selected clock signal to the analog-to-digital converter 203 as a clock signal ADCLK. The internal oscillator 207 is a CR oscillation circuit, for example, to generate the internal clock signal CRCLK. Immediately after the power supply is turned on, the external clock signal XCLK is not stable, so that the switching signal MD is turned to a low level and the internal clock signal CRCLK is supplied to the analog-to-digital converter 203 as the clock signal ADCLK. The arithmetic operation of the offset correction value OFST below is performed by using a stable waiting time of the external clock signal XCLK. The external clock signal XCLK is generated by, for example, a quartz-crystal circuit and a phase-locked loop (PLL) circuit.

Next, at Step S405, when the power-on reset signal PONR falls to a low level, the timing control circuit 209 outputs a two-bit control signal SW of "00" at a time t1. When receiving the two-bit control signal SW of "00," the selector 208 selects a lowest voltage GNDI to output the lowest voltage GNDI to the analog-to-digital converter 203 as the input analog voltage ADIN. The lowest voltage GNDI is the lowest voltage in the input range of the analog voltage ADIN to the analog-to-digital converter 203 and is 0 [V], for example.

Next, at Step S406, the timing control circuit 209 outputs a start signal ST having a high-level pulse to the analog-to-digital converter 203 after a predetermined time elapses after the time t1. Then, the analog-to-digital converter 203 in synchronization with the clock signal ADCLK receives the analog voltage ADIN and converts the analog voltage ADIN into a digital value ADOUT to output the converted digital value ADOUT to the offset correction unit 204.

Next, at Step S407, the switch 211 outputs the digital value ADOUT to the register 212 because of the two-bit control signal SW being "00." The digital value ADOUT is written in the register 212. That is, in the register 212, the digital value ADOUT to be output from the analog-to-digital converter 203 by the analog-to-digital converter 203 receiving the lowest voltage GNDI is written.

Next, at Step S408, the timing control circuit 209 outputs a two-bit control signal SW of "11" at a time t2 after a predetermined time elapses after the time t1. When receiving the two-bit control signal SW of "11," the selector 208 selects a highest voltage AVRHI to output the highest voltage AVRHI to the analog-to-digital converter 203 as the input analog voltage ADIN. The highest voltage AVRHI is the highest voltage in the input range of the analog voltage ADIN to the analog-to-digital converter 203 and is 5 [V], for example.

Next, at Step S409, the timing control circuit 209 outputs the start signal ST having a high-level pulse to the analog-to-digital converter 203 after a predetermined time elapses after the time t2. Then, the analog-to-digital converter 203 in synchronization with the clock signal ADCLK receives the analog voltage ADIN and converts the analog voltage ADIN into a digital value ADOUT to output the converted digital value ADOUT to the offset correction unit 204.

Next at Step S410, the switch 211 outputs the digital value ADOUT to the register 213 because of the two-bit control signal SW being "11." The digital value ADOUT is written in the register 213. That is, in the register 213, the digital value ADOUT to be output from the analog-to-digital converter 203 by the analog-to-digital converter 203 receiving the highest voltage AVRHI is written.

Next, at Step S411, the complementing processing circuit 215 complements a digital value FREG1 stored in the register 213 to output a digital value FREG2. The digital value FREG2 is expressed by FREG2=−1×FREG1. The adder 216 adds a value "4096" stored in the register 214 and the digital value FREG2 to output a digital value FREG3 (=4096−FREG1). The value "4096" is the maximum value in the output range of the 12-bit analog-to-digital converter 203. The digital value FREG3 corresponds to the error A2 in FIG. 1A.

The adder 217 adds a digital value ZREG stored in the register 212 and the digital value FREG3 to output a digital value ZF. The digital value ZREG corresponds to the error A1 in FIG. 1A and the digital value FREG3 corresponds to the error A2 in FIG. 1A. The digital value ZF corresponds to A1+A2.

The one-bit right-shift circuit 218 right shifts the digital value ZF by one bit to thereby output the offset correction value OFST (=ZF/2). The offset correction value OFST corresponds to the offset correction value A3 (=(A1+A2)/2) in FIG. 1A.

Next, at Step S412, the analog-to-digital converter 203 receives the offset correction value OFST to perform setting of the offset correction value OFST. Thereafter, the timing control circuit 209 outputs a two-bit control signal SW of "01" at a time t3 after a predetermined time elapses after the time t2. When receiving the two-bit control signal SW of "01," the selector 208 selects an input analog voltage ANIN to output the input analog voltage ANIN to the analog-to-digital converter 203 as the input analog voltage ADIN.

Next, at Step S413, the timing control circuit 209 switches the switching signal MD to a high level from a low level. When the switching signal MD is turned to a high level, the clock control circuit 210 outputs the external clock signal XCLK to the analog-to-digital converter 203 as the clock signal ADCLK. That is, the clock control circuit 210 supplies the external clock signal XCLK to the analog-to-digital converter 203 after the stable waiting time of the external clock signal XCLK elapses.

Next, at Step S414, the reset generation circuit 205 switches the reset signal RS to a low level from a high level after a predetermined time elapses after a falling edge of the power-on reset signal PONR. The CPU 202 starts an operation in accordance with a program when the reset signal RS is turned to a low level. Specifically, the CPU 202 gives an instruction of the analog-to-digital conversion to the analog-to-digital converter 203 by a control signal CCN. Then, the analog-to-digital converter 203 converts the input analog voltage ADIN into a digital value in synchronization with the clock signal ADCLK to output a digital value ADOUT obtained by subtracting the offset correction value OFST from the converted digital value. This makes it possible to decrease the error of the analog-to-digital converter 203.

As described above, at Steps S405 to S407, the offset correction unit 204 stores a first digital value ZREG to be output from the analog-to-digital converter 203 by the analog-to-digital converter 203 receiving a first analog voltage (for example, the lowest voltage) GNDI in the register 212. Next, at Steps S408 to S410, the offset correction unit 204 stores a second digital value FREG1 to be output from the analog-to-digital converter 203 by the analog-to-digital converter 203 receiving a second analog voltage (for example, the highest voltage) AVRHI in the register 213. Next, at Step S411, the offset correction unit 204 arithmetically operates the offset correction value OFST based on the first digital value ZREG in the register 212 and the second digital value FREG1 in the register 213. After the arithmetic operation of the offset correction value OFST, the analog-to-digital converter 203 converts the input analog voltage ANIN into a digital value to output a digital value ADOUT obtained by subtracting the offset correction value OFST from the converted digital value.

The analog-to-digital converter 203 performs the analog-to-digital conversion in synchronization with the internal clock signal CRCLK in each of periods of arithmetically operating the offset correction value OFST t1 to t3. In contrast to this, after each of the periods of arithmetically operating the offset correction value OFST t1 to t3, the analog-to-digital converter 203 outputs the digital value ADOUT obtained by subtracting the offset correction value OFST from the analog-to-digital converted digital value in synchronization with the external clock signal XCLK.

According to this embodiment, the arithmetic operation of the offset correction value OFST is performed only immediately after the power supply application and no arithmetic operation of the offset correction value is performed in each analog-to-digital conversion, so that it is possible to prevent a decrease in speed of the analog-to-digital conversion. Further, the arithmetic operation of the offset correction value OFST is a simple arithmetic operation, so that the arithmetic operation can be performed by the offset correction unit 204. Further, the offset correction processing is also a simple arithmetic operation (subtraction), so that the arithmetic operation can be performed by the analog-to-digital converter 203. Thereby, the correction processing becomes unnecessary for the CPU 202, so that it is possible to reduce a processing load and to prevent a decrease in throughput. Further, it is possible to reduce a cost.

In the foregoing, there is described the method of arithmetically operating the offset correction value OFST by using the stable waiting time of quartz-crystal oscillation of the external clock signal XCLK, but a user may also get, for example, software to arithmetically re-operate the offset correction value OFST at arbitrary timing.

Further, the offset correction unit 204 or the CPU 202 can detect a fault of the analog-to-digital converter 203 based on the arithmetically operated offset correction value OFST. Specifically, as long as the offset correction value OFST is a value larger than a threshold value (an offset value or a value based on a standard value of an error), the offset correction unit 204 or the CPU 202 determines that the analog-to-digital converter 203 is at fault and sets an error flag, thereby being able to detect abnormality of the analog-to-digital converter 203 at the time of power on.

In this embodiment, the analog-to-digital converter 203 itself performs the offset correction. The arithmetic operation of the offset correction value OFST is achieved by hardware of the offset correction unit 204, the arithmetic operation in each analog-to-digital conversion is not needed, and development of software of the arithmetic operation processing is also unnecessary. Further, the correction processing using the CPU 202 becomes unnecessary, so that it is possible to reduce a load on the CPU 202 and further to provide the microcontroller 201 with high performance.

Further, in this embodiment, the analog-to-digital converter 203 itself performs the offset correction, so that a large-capacity memory for holding correction data therein is not needed. This makes it possible to obtain an effect of achievement of low cost achieved by a decrease in size of a semiconductor chip.

Further, the arithmetic operation of the offset correction value OFST can be selected at timing necessary for a user side, which is at the time of starting a power supply, at the time of external reset, at the time of a timer being triggered, at the time of occurrence of an interrupt, or the like, and it is possible to achieve a detailed arithmetic re-operation corresponding also to a usage environment.

Further, when the offset correction value OFST is in excess of a threshold value, this embodiment can detect abnormality of the analog-to-digital converter 203 and perform notification by an error flag. This enables the CPU 202 to achieve functional safety of an operation for a fault of the analog-to-digital converter 203 or abnormality of the converted value by software processing, interrupt processing, or the like corresponding to the error flag.

It is possible to correct an error by a simple arithmetic operation with no need for a large-capacity memory, so that it is possible to prevent a decrease in throughput and to prevent an increase in size of the analog-to-digital conversion device.

It should be noted that the above-described embodiment merely illustrates a concrete example of implementing the present invention, and the technical scope of the present invention is not to be construed in a restrictive manner by the embodiment. That is, the present invention may be implemented in various forms without departing from the technical spirit or main features thereof.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An analog-to-digital conversion device comprising:
    an analog-to-digital converter that receives an analog voltage and converts the analog voltage into a digital value to output the converted digital value; and
    an offset correction unit that arithmetically operates an offset correction value based on a first digital value and a second digital value, the first digital value being to be output from the analog-to-digital converter by the analog-to-digital converter receiving a first analog voltage, the second digital value being to be output from the analog-to-digital converter by the analog-to-digital converter receiving a second analog voltage, the second analog voltage having a voltage value different from that of the first analog voltage, wherein
    after the arithmetic operation of the offset correction value, the analog-to-digital converter outputs a digital value obtained by subtracting the offset correction value from the converted digital value.

2. The analog-to-digital conversion device, according to claim 1, wherein
    the first analog voltage is the lowest voltage in an input range of the analog-to-digital converter, and
    the second analog voltage is the highest voltage in the input range of the analog-to-digital converter.

3. The analog-to-digital conversion device according to claim 1, wherein
    the offset correction unit arithmetically operates an average value as the offset correction value, the average value being an average value of an absolute value of an error of the first digital value and an absolute value of an error of the second digital value.

4. The analog-to-digital conversion device according to claim 1, further comprising:
    an internal oscillator that generates an internal clock signal, wherein
    the analog-to-digital converter performs the conversion in synchronization with the internal clock signal in a period of arithmetically operating the offset correction value, and after the period of arithmetically operating the offset correction value, the analog-to-digital converter outputs a digital value obtained by subtracting the offset correction value from the converted digital value in synchronization with an external clock signal.

5. The analog-to-digital conversion device according to claim 1, further comprising:
    a power-on reset generation circuit that generates a power-on reset signal when a power supply voltage becomes higher than a threshold value, wherein
    when the power-on reset signal is generated, the offset correction unit starts to arithmetically operate the offset correction value.

* * * * *